United States Patent
Bauer et al.

(10) Patent No.: US 8,188,900 B2
(45) Date of Patent: May 29, 2012

(54) ANALOG-DIGITAL CONVERTER

(75) Inventors: Wolfram Bauer, Tuebingen (DE); Christoph Lang, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 550 days.

(21) Appl. No.: 11/795,430

(22) PCT Filed: Dec. 12, 2005

(86) PCT No.: PCT/EP2005/056670
§ 371 (c)(1), (2), (4) Date: Sep. 18, 2009

(87) PCT Pub. No.: WO2006/074847
PCT Pub. Date: Jul. 20, 2006

(65) Prior Publication Data
US 2011/0102215 A1    May 5, 2011

(30) Foreign Application Priority Data
Jan. 14, 2005 (DE) .................. 10 2005 001 733

(51) Int. Cl.
*H03M 1/12* (2006.01)
(52) U.S. Cl. ................... 341/155; 341/156
(58) Field of Classification Search ............ 341/155, 341/156, 154, 159, 139, 143
See application file for complete search history.

(56) References Cited

U.S. PATENT DOCUMENTS

| | | | |
|---|---|---|---|
| 3,626,306 A | 12/1971 | Puckette | |
| 3,858,200 A | 12/1974 | Henry | |
| 4,246,571 A | 1/1981 | Gariazzo et al. | |
| 4,365,236 A * | 12/1982 | Maida | 341/159 |
| 4,395,732 A * | 7/1983 | Upton | 348/27 |
| 4,831,382 A | 5/1989 | Debus, Jr. et al. | |
| 5,194,866 A | 3/1993 | Imaizumi et al. | |
| 5,343,201 A | 8/1994 | Takayama et al. | |
| 5,610,604 A * | 3/1997 | Leacock et al. | 341/138 |
| 5,760,729 A * | 6/1998 | Rumreich | 341/159 |
| 5,936,566 A * | 8/1999 | Park | 341/159 |
| 6,072,416 A * | 6/2000 | Shima | 341/159 |
| 6,198,420 B1 * | 3/2001 | Ryan et al. | 341/155 |

(Continued)

FOREIGN PATENT DOCUMENTS

| | | |
|---|---|---|
| DE | 19626599 | 1/1998 |
| EP | 0 520 662 | 12/1992 |
| FR | 2 529 043 | 12/1983 |

(Continued)

OTHER PUBLICATIONS

Patent Abstracts of Japan, vol. 014, No. 163 (E-0910), Mar. 29, 1990 & JP 02 019025 A (Yokogawa Electric Corp), Jan. 23, 1990 abstract; figure 1.

(Continued)

*Primary Examiner* — Jean B Jeanglaude
(74) *Attorney, Agent, or Firm* — Kenyon & Kenyon LLP

(57) ABSTRACT

In a system based on an analog-digital converter (ADC) having an analog input signal and at least one quantization threshold, the analog-digital converter (ADC) includes an arrangement for varying the at least one quantization threshold.

9 Claims, 6 Drawing Sheets

U.S. PATENT DOCUMENTS

| | | | |
|---|---|---|---|
| 6,335,698 B1 | 1/2002 | Ker et al. | |
| 6,473,019 B1 * | 10/2002 | Ruha et al. | 341/143 |
| 6,556,158 B2 * | 4/2003 | Steensgaard-Madsen | 341/131 |
| 2002/0149507 A1 | 10/2002 | Kaul et al. | |
| 2006/0244643 A1 * | 11/2006 | Da Fonte Dias | 341/143 |

FOREIGN PATENT DOCUMENTS

| | | |
|---|---|---|
| JP | 6-77343 | 10/1994 |
| JP | 2002-261610 | 9/2002 |
| SU | 1 571 760 | 6/1990 |
| WO | 2004/006439 | 1/2004 |

OTHER PUBLICATIONS

Kim D et al: "A Single Chip Delta-Sigma ADC With a Built-In Variable Gain Stage and DAC With a Charge Integratin Subconverter for a 5 V 9600-B/S Modem" IEEE Journal of Solid-State Circuits, IEEE Service Center, Piscataway, NJ, US, vol. 30, No. 8, Aug. 1, 1995, pp. 940-943, XP000524393 ISSN: 0018-9200 p. 940, col. 1, paragraph III—p. 941, col. 1, paragraph III; figure 2.

Patent Abstracts of Japan, vol. 006, No. 060 (E-102), Apr. 17, 1982 & JP 57 002170 A (NEC Corp), Jan. 7, 1982 abstract; figures 1, 2.

* cited by examiner

Differential Flash ADC

ANALOG-DIGITAL CONVERTER

CROSS-REFERENCE TO RELATED APPLICATIONS

The present application is a U.S. National Phase application of PCT/EP2005/056670, which claims the benefit of priority to German Patent Application No. 102005001733.9, filed Jan. 14, 2005.

FIELD OF THE INVENTION

The present invention is based on an analog-digital converter having an analog input signal and at least one quantization threshold.

BACKGROUND INFORMATION

Digital automatic controllers lend themselves to the control of analog variables since they have the following advantages: The time constants can be set digitally, so that temperature dependencies as well as ageing are ruled out. The time constant can be selected arbitrarily large. In this case the use of external components to realize large time constants is dispensed with. As a result, the systems become cost-effective, and the robustness with respect to electromagnetic radiation increases.

FIG. 1 shows such a feedback control loop in the form of a basic block diagram. The digital automatic control of an analog variable requires the use of an analog-digital converter (ADC). It compares its analog input signal, which may be routed via an analog pre-amplifier, with its quantization thresholds and outputs a correspondingly quantized digital value. This digital value is processed by the automatic controller and forwarded to a digital-analog converter, which acts on the analog variable to be controlled by its analog output signal.

However, these feedback control systems have one disadvantage. If the input signal of the ADC is between two quantization thresholds and changes to such a negligible degree that no further quantization threshold is exceeded, then the ADC likewise does not respond to the change of the input signal. That is to say, the analog variable to be regulated may change without the digital automatic controller intervening. Only if the analog signal has changed so significantly that a quantization threshold of the ADC is exceeded, does the digital automatic controller intervene. There is then the risk that the analog variable to be controlled is controlled back and forth between two quantization thresholds of the ADC, which produces a so-called limit cycle. If the frequency of this limit cycle is so small that it is not suppressed by the output filter of the system, then the afore-described effect leads to interference in the output signal of the system.

One possibility for reducing the amplitude of the limit cycle is to reduce the spacing between two quantization thresholds in the ADC, which reduces the quantization error of the ADC. However, with the measuring range remaining unchanged, the number of quantization thresholds must be increased.

Even if the ADC is not used in a feedback control system, there is the risk that the input signal of the ADC changes between two thresholds without the ADC responding by a change in its output signal. This is referred to as a "dead zone".

Higher demands are imposed on the ADC in the conversion of analog oscillations having a high frequency. To detect the high-frequency analog oscillation, the conversion rate of the ADC must be high. In this case the use of a flash ADC suggests itself, which compares an analog input signal to each of its quantization thresholds at a particular instant. This is accomplished by the use of comparators, each of which compares the input signal to an analog reference.

One possible application example is the automatic control of a high-frequency oscillatory amplitude having a relatively small controller bandwidth. In the process, the analog oscillation is converted into the digital by a flash ADC. The rectification and subsequent deep-pass filtering will then be implemented in the digital realm. This is illustrated in FIG. 2.

SUMMARY OF THE INVENTION

The exemplary embodiment and/or exemplary method of the present invention is based on an analog-digital converter having an analog input signal and at least one quantization threshold. The analog-digital converter includes an arrangement for varying the at least one quantization threshold. This has the advantage that the resolution is able to be varied by modifying the quantization threshold.

It is especially advantageous that the variation of the at least one quantization threshold may be implemented in a normal operating state. This prevents dead zones and limit cycles.

In addition, it is advantageous that the analog-digital converter has at least two quantization thresholds, and the arrangement for varying at least one quantization threshold are configured in such a way that the difference in value between the two quantization thresholds is variable.

It is especially advantageous that the arrangement for varying at least one quantization threshold are configured in such a way that a selective variation of the quantization threshold by an average value is represented. By averaging the digital output signal across a plurality of variations of the quantization threshold, it is possible to filter out effects of these variations on the digital output signal.

One advantageous development of the exemplary embodiment and/or exemplary method of the present invention provides that the analog to digital conversion and/or the arrangement for varying at least one quantization threshold are/is controlled by a clock pulse. This advantageously makes it possible to use flash ADCs and to specify the instant of the analog to digital conversion. This is advantageous in view of signals that are variable over time, such as high-frequency periodic signals.

It is advantageous, in particular, that the analog input signal (U_in) of the analog-digital converter represents a periodic signal and that the clock pulse (645) has a fixed phase relation to this periodic signal.

One advantageous development of the exemplary embodiment and/or exemplary method of the present invention provides an analog-digital converter having a system of comparators (K1, . . . K7) as triggers, a first reference voltage U_ref, and a system of resistors (R1, . . . , R6) for representing additional reference voltages for the specification of quantization thresholds, the reference voltages having been generated from first reference voltage U_ref. The arrangement for varying at least one quantization threshold are developed as controllable resistors (R1, . . . , R6).

Another advantageous development of the exemplary embodiment and/or exemplary method of the present invention provides an analog-digital converter having a system of comparators (K1, . . . K7) as triggers, a first reference voltage U_ref, and a system of resistors (R1, . . . , R6) for representing additional reference voltages for the specification of quantization thresholds, the reference voltages having been generated from first reference voltage U_ref. The arrangement for varying at least one quantization threshold are developed as controllable current source (I_wuerfel), which is connected to the system of resistors (R1, . . . , R6).

The exemplary embodiment and/or exemplary method of the present invention is advantageous for suppressing limit cycles in feedback control systems, for instance, or in converting analog oscillations having high frequencies. Another application area of the exemplary embodiment and/or exemplary method of the present invention is a digital phase-locked loop (PLL). Furthermore, in systems that have no feedback the exemplary embodiment and/or exemplary method of the present invention has the advantage of reducing the dead zones of the ADC.

Advantageous is a selective variation of the amplification of the analog-digital converter (ADC) by an average value (scrambling) over time in order to reduce the average quantization error of the ADC in this manner.

One advantageous development of the exemplary embodiment and/or exemplary method of the present invention includes a switching principle according to FIG. 4 for scrambling the amplifications of a flash ADC. Amplification scrambling by scrambling the current flowing through the resistor network shown in FIG. 4, which is easy to realize, is advantageous in this context. Also advantageous is amplification scrambling by the use of controlled resistors in the resistor network shown in FIG. 4. Especially advantageous is a fully differential realization of the switching principle shown in FIG. 4, as shown in FIG. 5.

One advantageous development of the exemplary embodiment and/or exemplary method of the present invention includes filtering of the measuring results of the ADC with the aid of a digital filter so as to allow further processing of the average value of the ADC output signal and suppression of the influence of the amplification scrambling on the output signal of the system. Especially advantageous is a configuration of the digital filter such that there is a zero value in the repetition frequency of the variation of the amplifications.

It is advantageous to derive the clock pulse frequency of the digital filter from the analog oscillation to be regulated, which has the effect that the frequency of the zero value of the digital filter automatically adapts to the repetition frequency of the amplifications and the effect of the filter always remains optimal across temperature and service life as well.

It is advantageous to use a flash ADC having amplification scrambling according to the exemplary embodiment and/or exemplary method of the present invention in systems in which a variable, which is a function of a high-frequency oscillation, is regulated in a relatively low-frequency manner. Particularly advantageous is the use for a digital amplitude control and a digital phase control (PLL).

One advantageous development of the exemplary embodiment and/or exemplary method of the present invention includes an adjustment of the various values of the ADC amplifications in a repeating series of amplifications, in such a way that the values of the amplifications result from the superimposing of amplification sequences having different frequencies, thereby reducing the amplitude of a limit cycle and distributing it to a broad frequency spectrum having a low incidental amplitude.

Additional advantageous refinements can be gathered from the description herein.

DETAILED DESCRIPTION

The exemplary embodiment and/or exemplary method of the present invention will be illustrated in detail on the basis of the specific embodiments described in the following text.

Figure 1:
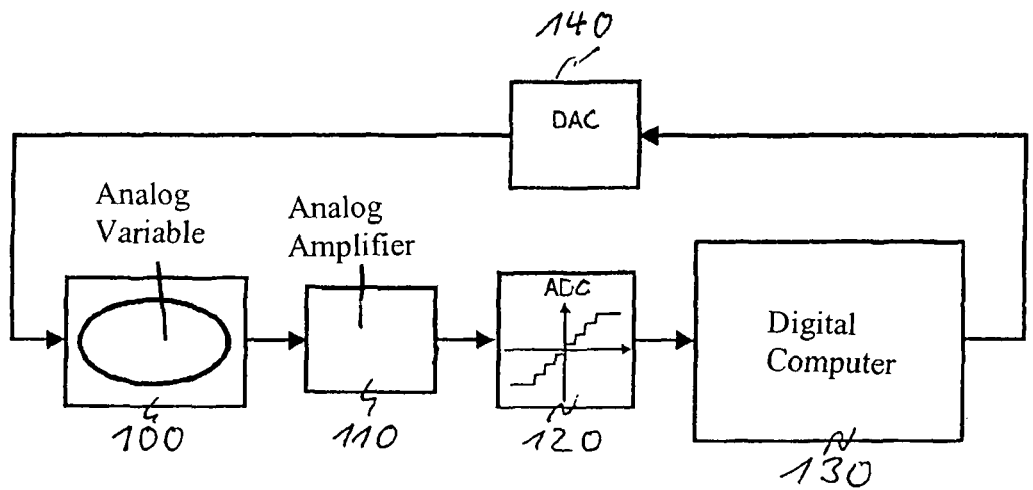
FIG. 1 shows a digital automatic control for analog signals, using an analog-digital converter.

FIG. 1 shows a digital automatic control for analog signals using an analog-digital converter. Such a feedback control circuit is shown in the form of a basic block diagram. An analog variable 100 generates an analog input signal, which is forwarded to an analog amplifier 110. The amplified analog input signal is then forwarded to an analog-digital converter (ADC) 120 and converted into a digital input signal. The digital input signal is conveyed to a digital automatic controller 130, which generates a digital control signal therefrom. The digital control signal is forwarded to a digital-analog converter 140, which generates an analog control signal therefrom. The analog control signal is then in turn forwarded to analog variable 100, thereby closing the feedback control circuit.

The digital automatic control of an analog variable requires the use of an analog-digital converter (ADC). It compares its analog input signal, which may be routed via an analog preamplifier, with its quantization thresholds and outputs a correspondingly quantized digital value. This digital value is processed by the automatic controller and forwarded to a digital-analog converter, which acts on the analog variable to be controlled by its analog output signal.

However, such automatic control systems have the following disadvantage. If the input signal of the ADC is between two quantization thresholds and changes to such a negligible degree that no further quantization threshold is exceeded, then the ADC likewise does not respond to the change of the input signal. That is to say, the analog variable to be regulated may change without the digital automatic controller intervening. Only if the analog signal has changed so significantly that a quantization threshold of the ADC is exceeded, does the digital automatic controller intervene. There is then the possibility that the analog variable to be controlled is controlled back and forth between two quantization thresholds of the ADC, which produces a so-called limit cycle. If the frequency of this limit cycle is so small that it is not suppressed by the output filter of the system, then the afore-described effect leads to interference in the output signal of the system.

One possibility for reducing the amplitude of the limit cycle is to reduce the spacing between two quantization thresholds in the ADC, which reduces the quantization error of the ADC. However, with the measuring range remaining unchanged, the number of quantization thresholds must be increased.

Even if the ADC is not used in a feedback control system, there is the risk that the input signal of the ADC changes between two thresholds without the ADC responding by a change in its output signal. This is referred to as a "dead zone".

Higher demands are imposed on the ADC in the conversion of analog oscillations having a high frequency. To record the high-frequency analog oscillation, the conversion rate of the ADC must be high. The use of a flash ADC, which compares an analog input signal to all of its quantization thresholds at a particular instant, suggests itself in such a case. This comparison is accomplished by the use of comparators, each of which compares the input signal to an analog reference. To specify the instant at which the comparison takes place, the flash ADC is clocked in the manner that is usual in the related art.

Figure 2:
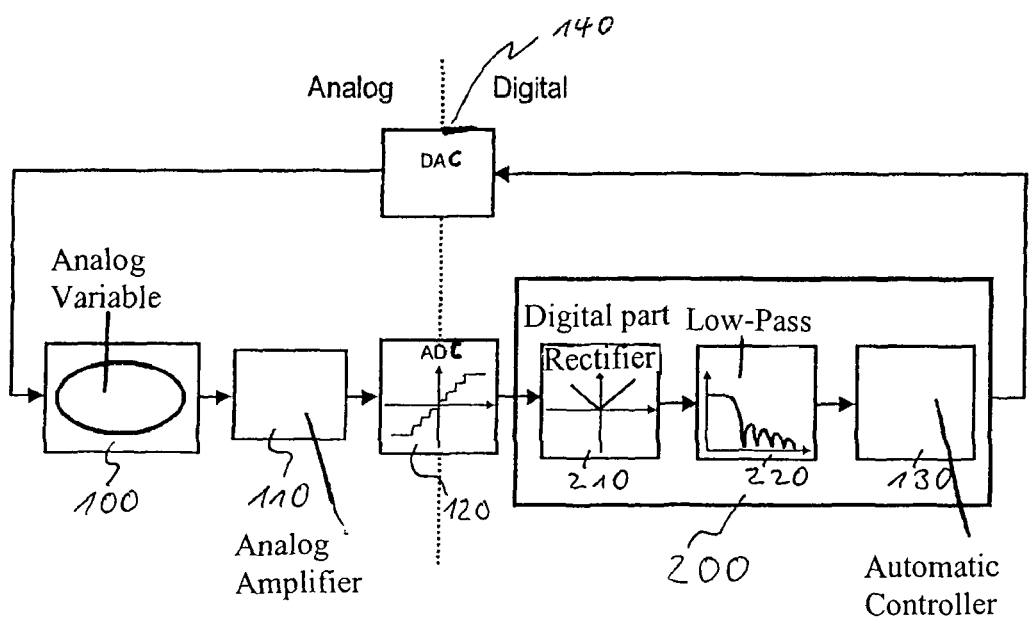
FIG. 2 shows a digital automatic control for high-frequency analog oscillation signals, using an analog-digital converter.

One typical application example is the automatic control of a high-frequency oscillatory amplitude having a relatively small controller bandwidth. In the process, the analog oscillation is converted into the digital by a flash ADC. The rectification and subsequent deep-pass filtering then takes place in the digital realm. FIG. 2 shows an exemplary digital automatic control for high-frequency, analog oscillation signals with the aid of an analog-digital converter. Illustrated is an expanded feedback control circuit according to FIG. 1. Downstream from analog-digital converter (ADC) 120 in the signal path there is a digital component 200. The digital control signal, which is forwarded to digital-analog converter 140, is generated in digital component 200. On the input side, digital component 200 has a rectifier 210 in the signal path, which rectifies the input signal. This is followed by a low-pass 220, where the signal is filtered. Finally, this is followed by digital automatic controller 130 in which the digital control signal is generated.

The analog digital converter ADC according to the exemplary embodiment and/or exemplary method of the present invention is suitable, for instance, for suppressing limit cycles in such systems. Furthermore, in systems that have no feedback the exemplary embodiment and/or exemplary method of the present invention has the advantage of reducing the dead zones of the ADC.

One development of the analog-digital converter ADC according to the exemplary embodiment and/or exemplary method of the present invention provides for selective scrambling of the amplifications of the ADC. This means that the ADC is operating at a constant amplification and at the corresponding positions of its quantization thresholds for a specified period of time. After this time period has elapsed, the amplification in the ADC is varied in that the position of its quantization thresholds is shifted by a factor. A flash ADC according to the exemplary embodiment and/or exemplary method of the present invention may be utilized for this purpose. Using this amplification setting, the ADC is now once again operated over a fixed period of time until its amplification is switched again. This results in a sequence of amplifications, each of which is applied for a limited period of time. This series of amplifications will vary by an average value and may repeat itself at a frequency.

FIG. 3 shows an exemplary variation of the amplification by an analog-digital converter of the present invention. According to the exemplary embodiment and/or exemplary method of the present invention, the variation of the amplification may take place during normal operation of the analog-digital converter, in particular also outside of trimming operations for the preparatory setting of the analog-digital converter. The three diagrams illustrate how, for a constant input value at the ADC, a reduction in the quantization error and thereby an increase in the resolution of the ADC is achieved by varying the converter's amplification. To this end, digital output value ADC_out is plotted over analog input voltage U_in.

Figure 3A:
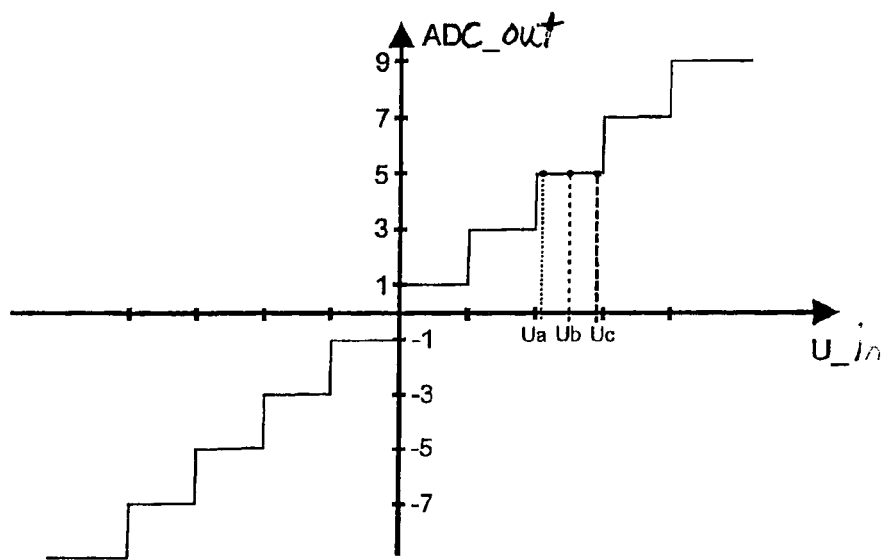
FIGS. 3A, 3B, 3C show, by way of example, the variation of the amplification by an analog-digital converter according to the exemplary embodiment and/or exemplary method of the present invention.

In FIG. 3a, the characteristic curve of the ADC is shown for an average amplification by way of example. The digital output value "ADC_out" of the ADC is plotted over the input voltage "U_in" of the ADC. At this average amplification of the converter, the ADC responds to the three different input voltages Ua, Ub and Uc by the same digital output value (5).

Figure 3B:
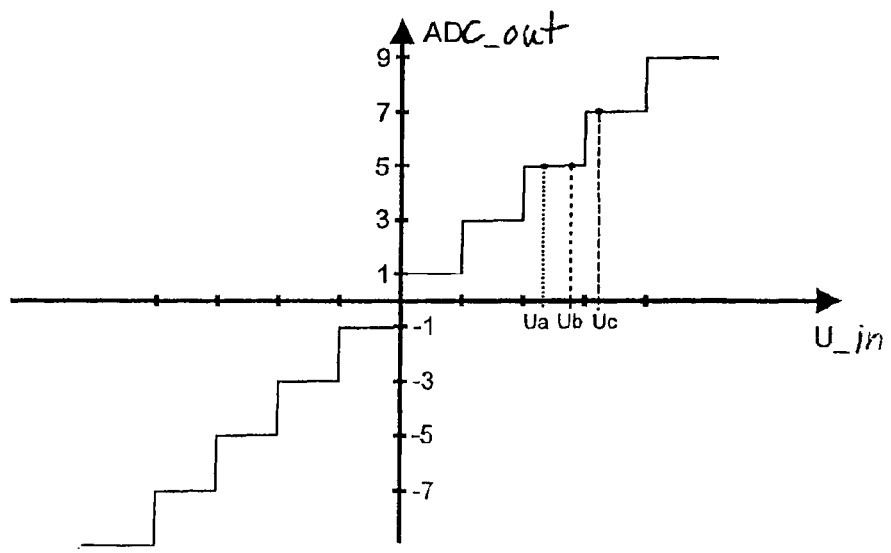

If the spacing between the quantization thresholds is reduced by 10%, then the amplification of the ADC rises accordingly. The resulting characteristic curve is shown in FIG. 3b. According to this characteristic curve, the ADC responds by the digital value of 5 for input voltages Ua and Ub, and by the digital value of 7 for input voltage Uc.

Figure 3C:
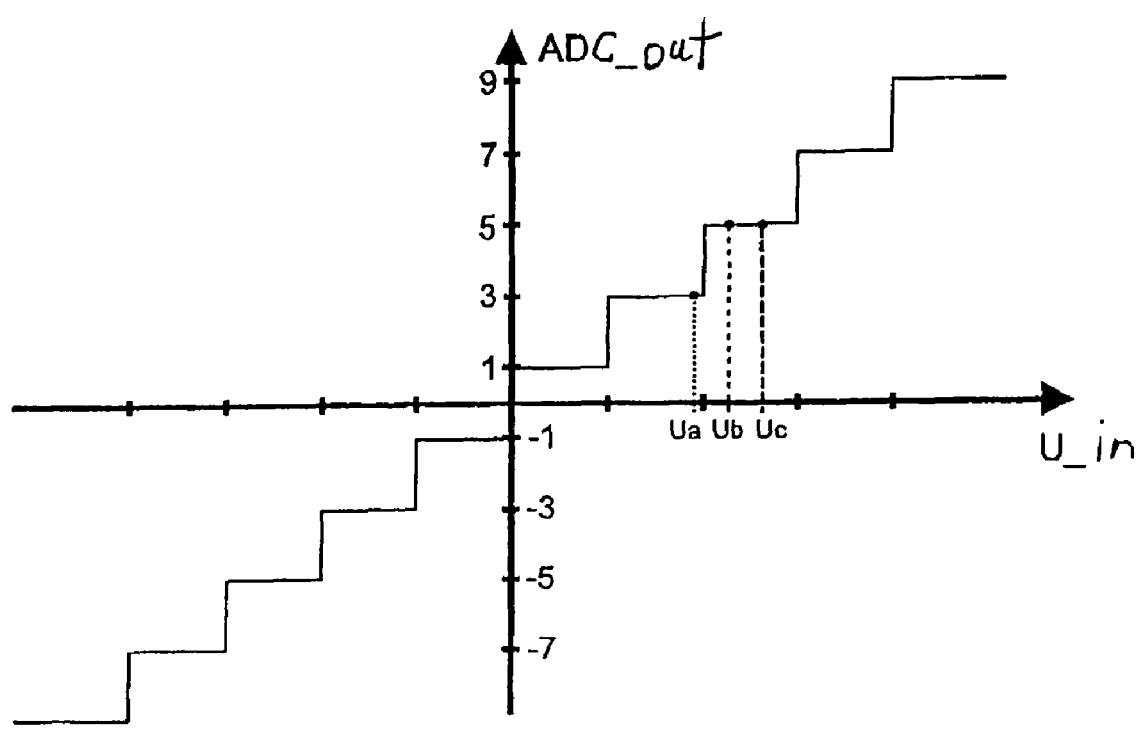

FIG. 3c shows the converter characteristic curve for a low amplification of the ADC. The spacing of the quantization thresholds is increased by 10% in this case. The ADC reacts by the digital value of 3 for input voltage Ua, and by the digital value of 5 for input voltages Ub and Uc.

If the average value of the corresponding ADC output is now formed for each of the three different input voltages (Ua, Ub and Uc), then the average values (Ua: 4.33; Ub: 5; Uc: 5.66) differ due to the scrambled, i.e., suitably sequence-modified, ADC amplifications, thereby reducing the average quantization error of the ADC, increasing the resolution of the converter, and thus making it possible to suppress limit cycles in a feedback control circuit.

If the input signal of the ADC represents an analog oscillation and if a constant amplification is set for an individual cycle of this oscillation, then the signal form, including zero crossing, is able to be detected by the high sampling rate of the ADC. The averaging across several periods having a plurality of different ADC amplifications increases the resolution with regard to the amplitude. The variation of the oscillatory amplitude is therefore detectable at an earlier time and leads to an earlier change in the input signal of the automatic controller, which is able to intervene even before a limit cycle occurs.

Another application field for an analog-digital converter according to the exemplary embodiment and/or exemplary method of the present invention is a digital phase-locked loop PLL as shown in the following text.

The frequency at which the various amplifications of the ADC repeat themselves must be selected in such a way that it lies above the bandwidth of the digital feedback control circuit. This ensures that the scrambling of the ADC amplifications will not have an adverse effect on the analog variable to be controlled.

Another development of the exemplary embodiment and/or exemplary method of the present invention uses a digital filter in the automatic controller, as shown in FIG. 2, which has a zero value in the repeat frequency of the ADC amplifications in order to minimize the interfering effect of the amplification scrambling on the analog signal to be controlled.

Another development of the exemplary embodiment and/or exemplary method of the present invention derives the clock frequency of this filter from the analog oscillation that is to be controlled, which causes the frequency of the zero value of the digital filter to automatically adapt itself to the repeat frequency of the amplifications, and the effect of the filter to remain optimal across temperature and also across service life at all times. This is particularly suitable for a digital PLL, for example, as elucidated in the text further below.

To avoid limit cycles, another development of the exemplary embodiment and/or exemplary method of the present invention consists of scrambling the amplifications of the ADC by using not only a single frequency. The chronological sequence of the amplitudes of the ADC amplifications may also be determined by adding up different sequences at which the amplifications repeat themselves at different frequencies. The resulting sequence of amplifications then constitutes a frequency mix of amplifications. This makes the formation of a limit cycle having a single frequency even more difficult. Instead of concentrating the interference amplitude of the limit cycle to be suppressed to one frequency, the interferences are distributed to a broader frequency spectrum having smaller amplitudes.

Figure 4:
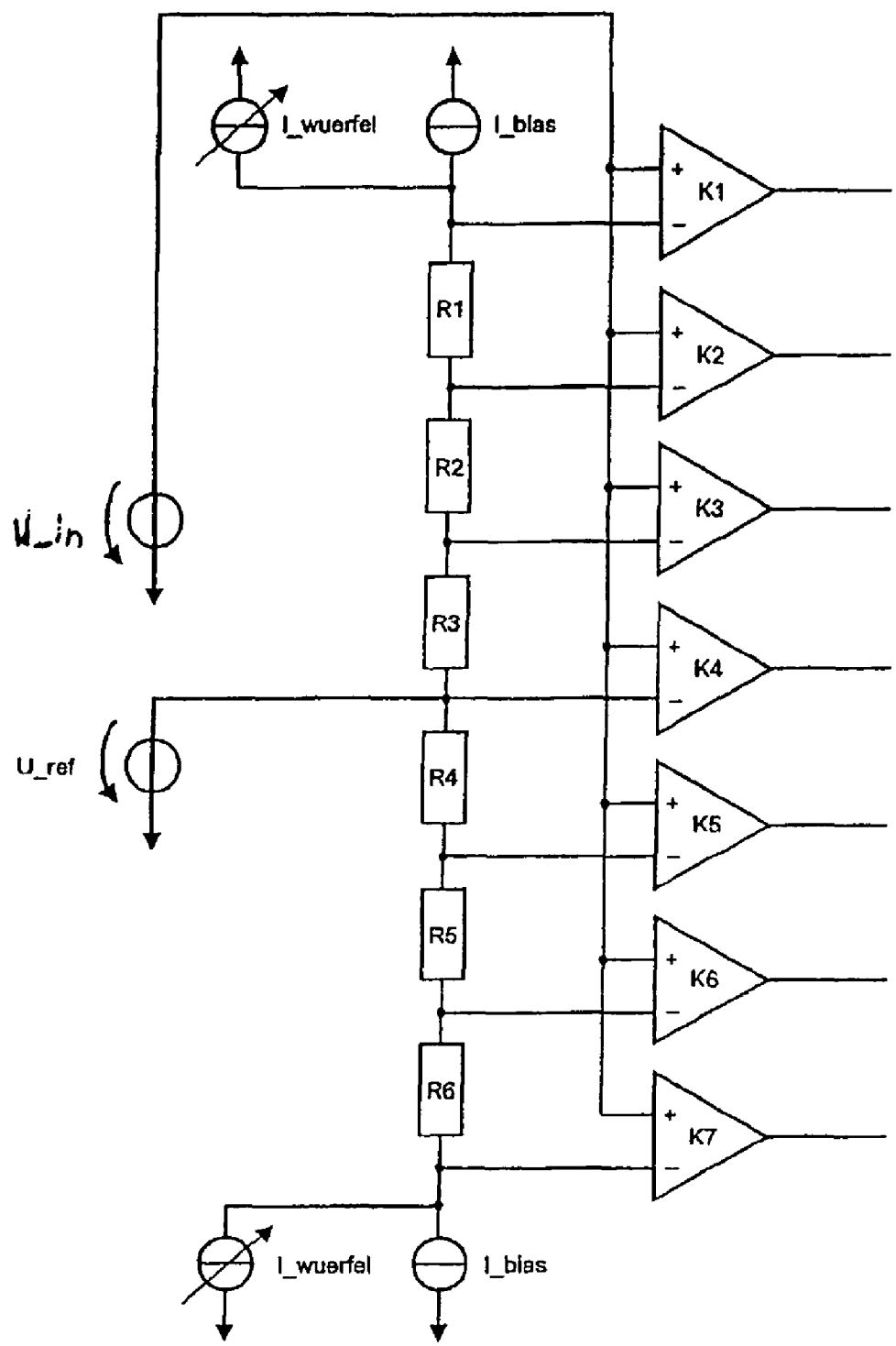
FIG. 4 shows one specific embodiment of the analog-digital converter according to the present invention, which has comparators having variable reference voltage.

In the following, an exemplary specific embodiment of an analog-digital converter ADC according to the present invention is shown. FIG. 4 illustrates a specific embodiment of the analog-digital converter according to the present invention, which includes comparators having variable reference voltage.

Analog-digital converter ADC shown by way of example is made up of seven comparators K1 through K7 to whose negative input an individual reference voltage is applied. These reference voltages represent the quantization thresholds to which the input signal U_in of the converter is compared. The reference voltages may be generated in the following manner.

The reference voltage of center comparator K4 is supplied by a reference voltage source U_ref. A current that is composed of the two partial currents I_bias and I-wuerfel flows through the resistor network made up of resistors R1 through R6. These currents are supplied by current sources that engage at resistor R1. The two current sinks I_bias and I_wuerfel, which engage with R6, discharge the current supplied by the current sources to ground. Accordingly, the reference voltage:

$$U\_refK2 = U\_ref + (I\_bias + I\_wuerfel) * (R2 + R3).$$

results at the negative input of comparator K2, for example.

If parameters U_ref, I_bias as well as all resistance values are kept constant, then the reference voltages and thus the amplifications of the ADC are able to be selectively scrambled (varied) via parameter I_wuerfel. This may be achieved through the use of an input signal or a control circuit for I_wuerfel (not shown). The input signal or the control circuit may be clocked. As an alternative to the scrambling of the reference voltage shown in FIG. 4 with the aid of a scrambling current I_wuerfel, it is also possible to utilize switchable resistors, which are likewise controllable by a control circuit. After a specific sequence of amplifications of the ADC, the amplification should assume a fixed value on average across this entire sequence.

Figure 5:
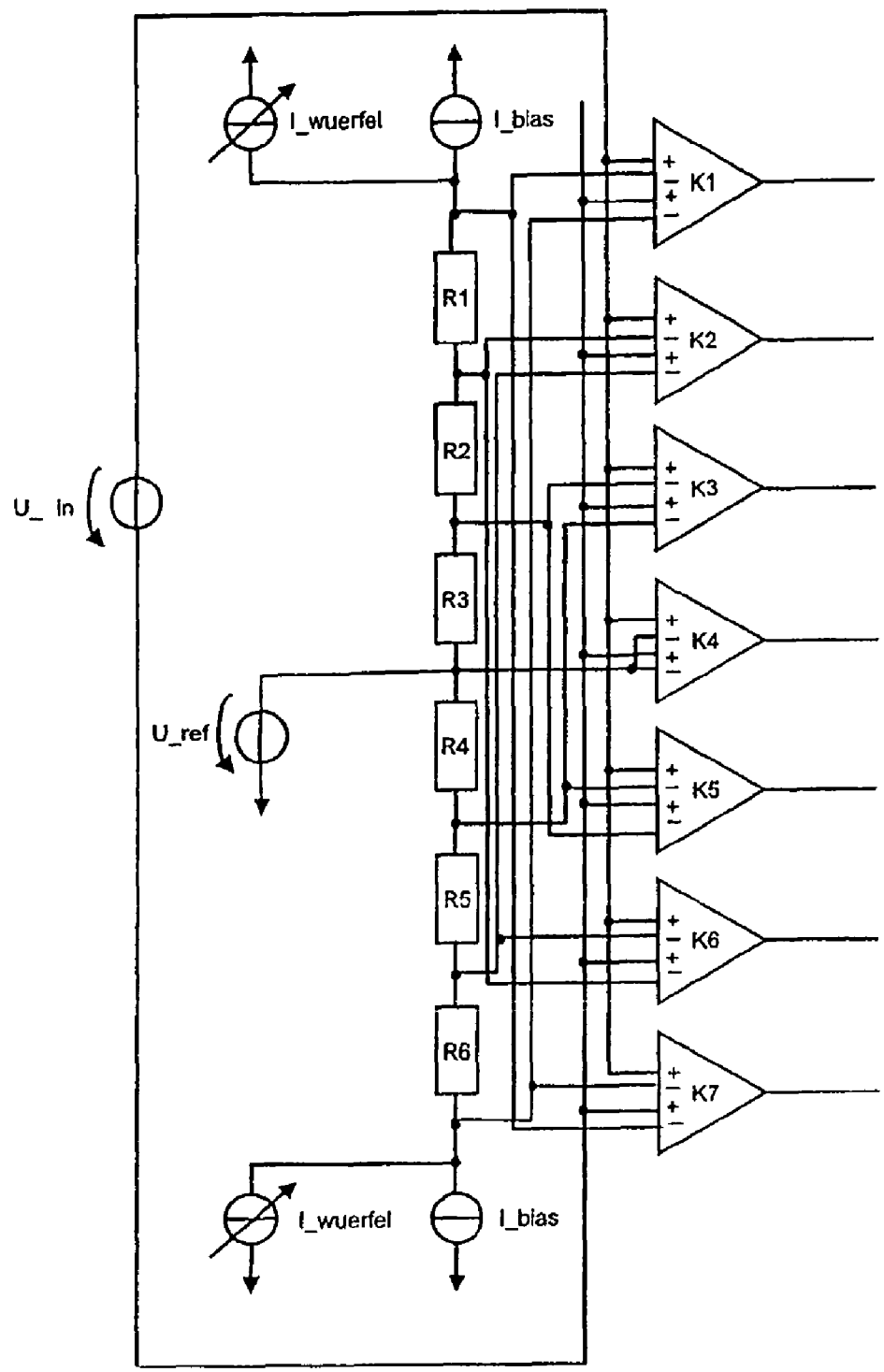
FIG. 5 shows a specific embodiment of the analog-digital converter according to the present invention, which includes comparators having fully differential variable reference voltage.

This switching principle is characterized by very simple implementability and the very small space requirement. Furthermore, this switching principle is also transferable to fully differential circuit realizations. In this context FIG. 5 shows a specific embodiment of the analog-digital converter of the present invention that includes comparators having variable reference voltage in a fully differential manner. The switching elements are known from FIG. 4 and are operating in an analogous manner here.

To specify the instant at which the comparison takes place, the analog-digital converter as described in FIGS. 4 and 5 by way of example may be configured as flash ADC, and then is clocked in the manner known from the related art (not illustrated).

Another possibility for varying the amplification of the ADC is to vary the values of the resistors in the reference divider of the ADC. This may be done with the aid of controlled resistors such as field-effect transistors. This constitutes one development, and thus a different development, of the exemplary embodiment and/or exemplary method of the present invention.

Figure 6:
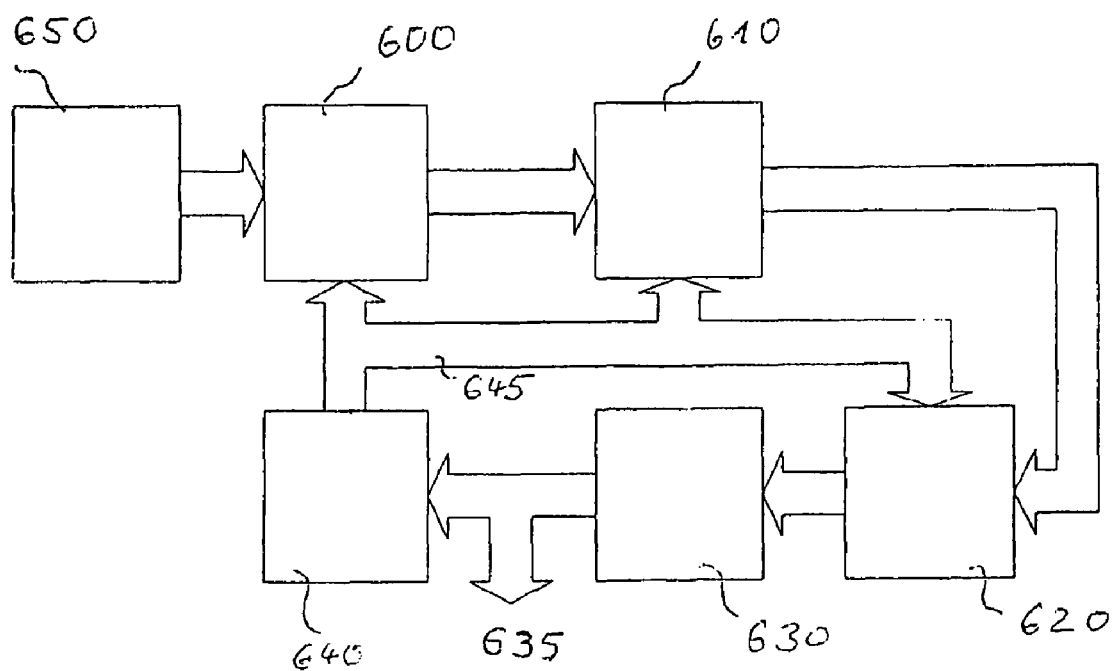
FIG. 6 schematically shows a digital phase-locked loop including an analog-digital converter according to the exemplary embodiment and/or exemplary method of the present invention.

Another application area for an analog-digital converter according to the exemplary embodiment and/or exemplary method of the present invention is a digital phase-locked loop PLL. FIG. 6 schematically shows a digital phase-locked loop, which includes an analog-digital converter according to the exemplary embodiment and/or exemplary method of the present invention. A flash ADC 600 detects voltage signal 650 of an analog oscillation at its input. Furthermore, phase-locked loop PLL includes a phase and frequency detector 610, a loop filter 620, a subassembly 630 having a digital-analog converter (DAC) and a voltage-controlled oscillator (VCO), as well as a divider 640. The voltage-controlled oscillator (VCO) generates a system clock 635, which is clocked down to a low-frequency clock signal 645 in divider 640. Clock signal 645 is forwarded to the components of the phase-locked loop PLL.

Flash ADC 600 is clocked using clock signal 645, the clock signal having a higher frequency than voltage signal 650, such that the sampling theorem is satisfied.

Phase-locked loop PLL synchronizes to voltage signal 650 of the analog oscillation at the input of the ADC. Digital filters like the low-pass described under FIG. 2 are operated using system clock 635 derived at the PLL. With that, all filter characteristics (such as zero values) change along with analog oscillation 650.

The flash ADC according to the exemplary embodiment and/or exemplary method of the present invention is particularly suited for setting up a phase-locked loop as it is disclosed in the German laid-open publication DE 102 47 996 A1.

In addition, further exemplary embodiments are conceivable as well.

What is claimed is:

1. An analog-digital converter having at least one quantization threshold, comprising:
   an analog signal input; and
   an arrangement to vary the at least one quantization threshold during an operating state of the analog-digital converter, in which the analog-digital converter performs a conversion.

2. The analog-digital converter of claim 1, wherein the at least one quantization threshold is at least two quantization thresholds, and the arrangement to vary the at least one quantization threshold is configured so that a difference in value between two quantization thresholds is variable.

3. The analog-digital converter of claim 2, wherein the arrangement to vary the at least one quantization threshold is configured so that variations in the at least one quantization threshold average out to a pre-selected value over time.

4. The analog-digital converter of claim 3, wherein the output is repeatedly varied in accordance with a single frequency.

5. The analog-digital converter of claim 3, wherein the output is repeatedly varied at different frequencies.

6. The analog-digital converter of claim 1, wherein a clock pulse controls at least one of an analog-to-digital conversion and the arrangement to vary the at least one quantization threshold.

7. The analog-digital converter of claim 6, wherein an analog input signal at the analog signal input is a periodic signal, and the clock pulse has a fixed phase relation to the periodic signal.

8. The analog-digital converter of claim 1, further comprising:
   a system of comparators as triggers;
   a system of resistors for representing reference voltages for specifying quantization thresholds, the reference voltages being generated from a first reference voltage;
   wherein the arrangement to vary the at least one quantization threshold includes the system of resistors which are configured as controllable resistors.

9. The analog-digital converter of claim 1, further comprising:
   a system of comparators as triggers;
   a system of resistors for representing reference voltages for specifying quantization thresholds, the reference voltages being generated from a first reference voltage;
   wherein the arrangement to vary the at least one quantization threshold is configured as a controllable current source that is coupled to the system of resistors.

* * * * *